(12) United States Patent
Yang et al.

(10) Patent No.: US 10,379,991 B2
(45) Date of Patent: Aug. 13, 2019

(54) SYSTEMS AND METHODS FOR ROUTING SAMPLED VALUES UPON LOSS OF PRIMARY MEASUREMENT EQUIPMENT

(71) Applicant: Schweitzer Engineering Laboratories, Inc., Pullman, WA (US)

(72) Inventors: Qiaoyin Yang, Pullman, WA (US); Normann Fischer, Colfax, WA (US)

(73) Assignee: Schweitzer Engineering Laboratories, Inc., Pullman, WA (US)

(*) Notice: Subject to any disclaimer, the term of this patent is extended or adjusted under 35 U.S.C. 154(b) by 22 days.

(21) Appl. No.: 15/711,898

(22) Filed: Sep. 21, 2017

(65) Prior Publication Data
US 2018/0089057 A1 Mar. 29, 2018

Related U.S. Application Data

(60) Provisional application No. 62/401,680, filed on Sep. 29, 2016.

(51) Int. Cl.
*G06F 11/34* (2006.01)
*H04L 12/721* (2013.01)
(Continued)

(52) U.S. Cl.
CPC ........ G06F 11/3495 (2013.01); H04L 41/046 (2013.01); H04L 41/0668 (2013.01);
(Continued)

(58) Field of Classification Search
CPC ...... G06F 11/3495; H04L 45/22; H04L 45/70; H04L 41/046; H04L 41/70; H04L 41/0627; H04L 41/0668
See application file for complete search history.

(56) References Cited

U.S. PATENT DOCUMENTS 8,024,494 B2  10/2011  Soeda
8,560,255 B2  10/2013  Elwarry
(Continued)

OTHER PUBLICATIONS

Costello, David: Understanding and Analyzing Event Report Information, Oct. 2000.
(Continued)

*Primary Examiner* — Nimesh G Patel
(74) *Attorney, Agent, or Firm* — Justin K. Flanagan; Richard M. Edge

(57) ABSTRACT

Systems and Methods are disclosed for providing measurement data redundancy to intelligent electronic devices (IEDs) in an electric power system, without additional redundant components. In various embodiments, a first measurement device obtains measurement data from a first portion of the electric power delivery system. A second measurement device obtains measurement data from a second portion of the electric power delivery system. A first IED monitors the first portion of the electric power delivery system based on measurement data associated with the first portion of the electric power delivery system, and a second IED monitors the second portion of the electric power delivery system based on measurement data associated with the second portion of the electric power delivery system. Assuming the first and second portions are coordinated, a communication system dynamically routes measurement data from the second measurement device to the first IED upon a failure of receiving digital measurements from the first measurement device.

20 Claims, 13 Drawing Sheets

(51) Int. Cl.
    *H04L 12/24*    (2006.01)
    *H04L 12/707*   (2013.01)
    *H04L 12/26*    (2006.01)
(52) U.S. Cl.
    CPC .......... *H04L 45/70* (2013.01); *H04L 41/0627* (2013.01); *H04L 43/0823* (2013.01); *H04L 45/22* (2013.01); *Y04S 40/166* (2013.01); *Y04S 40/168* (2013.01)

(56) References Cited

U.S. PATENT DOCUMENTS

| | | | |
|---|---|---|---|
| 2003/0048508 A1* | 3/2003 | Yu | H04B 10/506 398/91 |
| 2009/0012728 A1 | 1/2009 | Spanier | |
| 2009/0296583 A1 | 12/2009 | Dolezilek | |
| 2010/0040068 A1 | 2/2010 | Wimmer | |
| 2010/0183298 A1* | 7/2010 | Biegert | H04Q 11/0067 398/17 |
| 2016/0013632 A1 | 1/2016 | Lloyd | |
| 2017/0026291 A1* | 1/2017 | Smith | H04L 45/12 |
| 2017/0288950 A1* | 10/2017 | Manson | H04L 41/0668 |
| 2018/0034689 A1* | 2/2018 | Kanabar | H02J 13/0062 |

OTHER PUBLICATIONS

Perez, Joe: A Guide to Digital Fault Recording Event Analysis, 2010.
Considerations for Use of Disturbance Recorders; a Report to the System Protection Subcommittee of the Power System Relaying Committee of the IEEE Power Engineering Society, Dec. 27, 2006.
Costello, David: Event Analysis Tutorial, Part 1: Problem Statements, 2011.
Janne Starck, Antti Hakala-Ranta, Martin Stefanka, Switchgear Optimization Using IEC 61850-9-2 and Non-Conventional Measurements May 23, 2012.

* cited by examiner

SYSTEMS AND METHODS FOR ROUTING SAMPLED VALUES UPON LOSS OF PRIMARY MEASUREMENT EQUIPMENT

RELATED APPLICATIONS

This application claims priority under 35 U.S.C. § 119 to U.S. Provisional Patent Application No. 62/401,680 filed on Sep. 29, 2016, titled "System for Routing Sampled Values Upon Loss of Primary Equipment," which application is hereby incorporated by reference in its entirety.

TECHNICAL FIELD

This disclosure relates to routing sampled values from a secondary or alternative measurement device to an intelligent electronic device, upon loss of sampled values from a primary measurement device.

BRIEF DESCRIPTION OF THE DRAWINGS

The written disclosure herein describes illustrative embodiments that are non-limiting and non-exhaustive. Reference is made to certain of such illustrative embodiments that are depicted in the figures described below.

DETAILED DESCRIPTION

Figure 1:
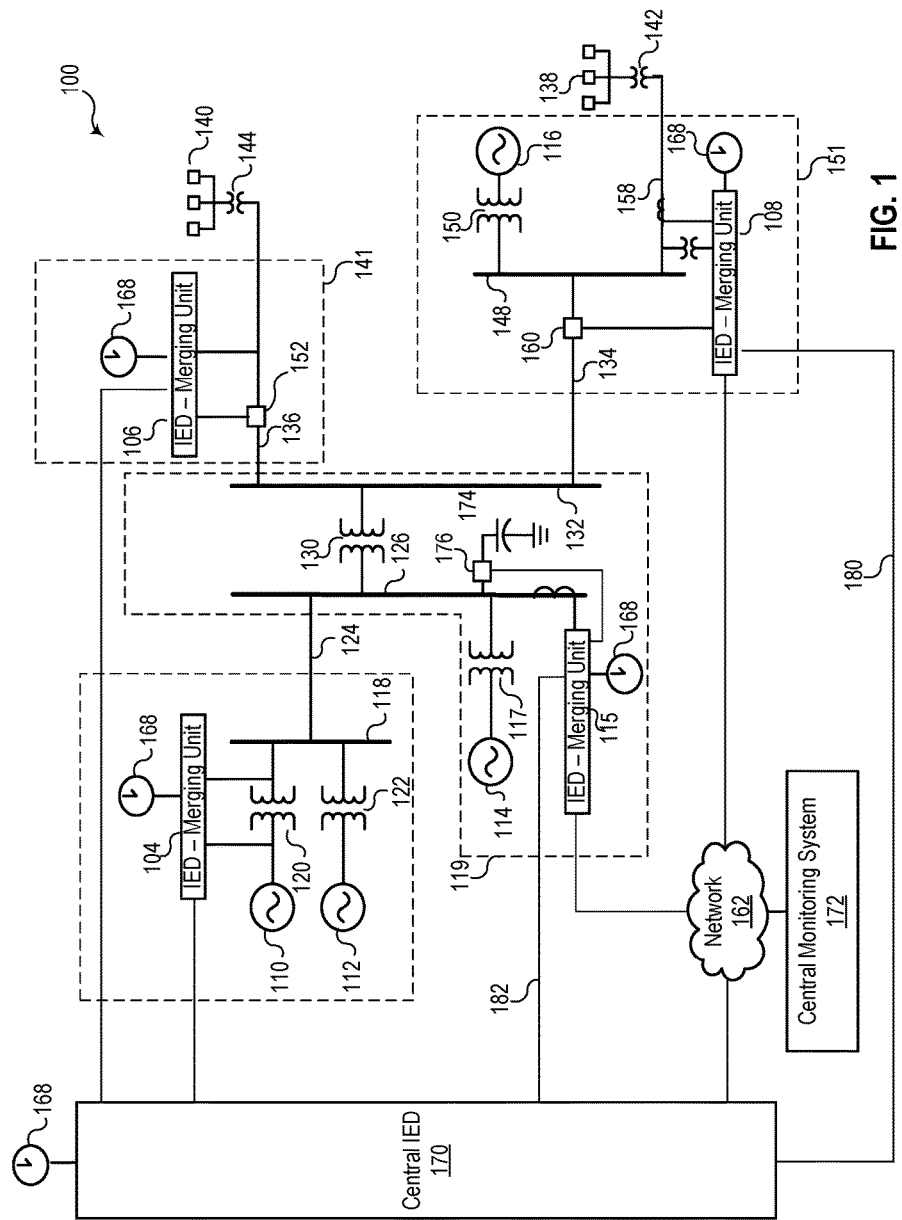
FIG. 1 illustrates a simplified one-line diagram of an example of an electric power system with an accompanying monitoring system.

Electric power delivery systems are used to distribute electric power from electric power generation sources to loads, which may be close or distant from the generation sources. Such systems may include generators or other sources, transformers step up or down voltages, transmission lines, buses, distribution lines, voltage regulators, capacitor banks, reactors, circuit breakers, switches, and other such equipment. Intelligent electronic devices (IEDs) may monitor, automate and/or protect electric power distribution equipment.

In some systems, IEDs obtain signals from the electric power delivery system via direct connection to current transformers (CTs), potential transformers (PTs), and the like. Any of a wide variety of measurement devices may be used to measure one or more characteristics of an electric power delivery system. The measurement devices may provide direct (e.g., analog) measurements to the IEDs and/or other monitoring equipment. Such IEDs may be configured with the particular physical and electrical parameters of the connected CTs and/or PTs, and may further include sampling hardware and software for converting the analog signals to digitized analog signals useful for determining a state of the electric power delivery systems.

In other embodiments, the measurement devices may provide sampled values at periodic intervals. In still other embodiments, the measurement devices may provide analog measurements that can be sampled by a sampling system. For example, in some embodiments, merging units may be in electrical communication with CTs and PTs. The merging unites may sample and digitize the signals from the CTs and PTs, and provide digitized electrical signals to connected IEDs.

In some embodiments, optical current transformers (OCTs), fiber-optic current transformers, optical potential transformers (OPTs), and/or fiber-optic potential transformers may be utilized in conjunction with various embodiments described herein. As previously noted, any of a wide variety or combination of varieties of measurement devices may be utilized.

Failure of a measurement device (e.g., a CT or a PT), a merging unit, and/or the communication system may prevent an IED from obtaining signals used for monitoring and protecting the electric power delivery system. This disclosure provides various system and methods to route measurement data from alternate measurement devices, that measure the same characteristic, in the event of such a failure.

For example, a communication system for dynamically routing power system signals to IEDs may include a first communication port to receive power system signals corresponding to measurements made by a first measurement device within a first portion of an electric power delivery system. A corresponding output port may output the power system signals from the first measurement device to a first IED configured to monitor the first portion of the electric power delivery system using received power system signals.

A second input port may receive power system signals corresponding to measurements made by a second measurement device within a second portion of the electric power delivery system. A corresponding output port may output the power systems signals from the second measurement device to a second IED configured to monitor the second portion of the electric power delivery system using received power system signals.

In various embodiments, the system may detect (e.g., actively detect, passively detect, or receive a notification thereof) that the first communication port has failed to receive the power system signals. A rerouting subsystem (e.g., a dynamic networking SV communicator) may dynamically route the power system signals received at the second input communication port from the second measurement device to the first IED.

In some embodiments, a first IED, measurement sensor, and merging unit may perform a first protective function (e.g., differential protection); while a second IED, measurement sensor, and merging unit may perform a different protective function (e.g., overcurrent protection). Normally, each of these two protective systems may function entirely independently. The presently described system allows for signal redundancy without any increase in redundant components, when the portions of the system are coordinated, by routing signals from the merging units between the two protective systems.

In the example above, each of the measurement devices may be a current transformer (CT) or a potential transformer (PT). The detection subsystem may detect a failure of the first measurement device (and/or associated merging unit) based on a loss of a fiber optic signal. Such detection may be quick enough that not even a single sample is lost by the affected IED. As a simple example, if detection is performed within 100 microseconds and sampled values are transmitted every 400 microseconds, lost samples are unlikely. If detection is performed in 100 microseconds and samples are transmitted every 1000 microseconds, lost samples are even less likely. The exact values of 100 microseconds, 400 microseconds, and 100 microseconds are merely examples. Any sample rate may be utilized and a correspondingly quick detection strategy may be utilized to reduce or eliminate the loss of sampled values.

In some embodiments, a buffer may be used to buffer one or more sampled values (or even raw analog data) from the measurement devices and/or merging units. The buffer may further reduce the likelihood of lost data reaching the IEDs due to a failure of a merging unit and/or measurement sensor.

Coordination of the first and second (and/or additional portions) of the electric power system may be based on a determination that a switch (e.g., a circuit breaker) is closed that connects the relevant portions. With the switch closed, it may be assumed based on theoretical modeling and/or actual measurements, that the measurement sensors in the first and second portions are measuring the same data.

Each measurement device may include a sensor (e.g., a CT or PT) and a merging unit. In some embodiments, a measurement device may be a stand-alone component that produces analog and/or digital signals corresponding to a condition or characteristic of the electric power system.

The systems described herein may be configured with one or more of the described components to perform a method of providing redundant electric power system signals to intelligent electronic devices (IEDs) upon a failure of a system component. A plurality of merging units may obtain electrical signals from a corresponding plurality of portions of an electric power system and create digitized electrical signals for delivery to a communication system that includes one or more dynamic networking SV communicators.

Communication systems using dynamic networking SV communicators may leverage software defined networking (SDN) concepts. Applying SDN architectures to operational technology (OT) allows for purpose-built switches that can be dynamically configured based on an electrical system's topology and current status of breakers and other devices that affect voltage, current, and/or phase on various portions of the system. In some embodiments, software-defined process bus networking applied to a physical network switch allows for protection and control redundancy, without any additional components being added to the system. Instead, software-defined process bus networking via the communication systems (e.g., dynamic networking SV communicators) described herein takes advantage of CT and PT arrangements in a substation to provide redundancy. Sometimes, polarity switching or adjustments may be required for the "redundant" signal to match the primary signal.

While the principles of software-defined process bus networking are often described as being applied to a switch, dynamic networking SV communicator, or other communication subsystem, it is also possible to implement within the IED itself by simply routing multiple feeds from merging units to an IED and letting the IED decide which to use.

Based on a determination that one or more portions of the electric power system are coordinated, a failure of a component in one portion of the electric power system may not result in a failure of an IED to perform its protective function. Instead, measurement data, such as data from a merging unit, in a different, unaffected portion of the electric power system may be rerouted and/or duplicated for routing to the affected portion of the electric power system.

For example, upon failure of a first merging unit to provide digitized electrical signals from a first portion of the electric power delivery system to the communication system, digitized electrical signals from a second merging unit in a second portion of the electrical power system may be provided to the first IED by the communication system.

The embodiments of the disclosure can be further understood by reference to the drawings, wherein like parts are designated by like numerals throughout. The components of the disclosed embodiments, as generally described and illustrated in the figures herein, could be arranged and designed in a wide variety of different configurations. Thus, the following description of the embodiments of the systems and methods of the disclosure is not intended to limit the scope of the disclosure, as claimed, but is merely representative of possible embodiments.

The phrases "connected to" and "in communication with" refer to any form of interaction between two or more components, including mechanical, electrical, magnetic, and electromagnetic interaction. Two components may be connected to each other, even though they are not in direct contact with each other, and even though there may be intermediary devices between the two components.

One or more of the described systems and methods may be implemented, monitored, and/or controlled by an intelligent electronic device (IED). As used herein, the term "IED" may refer to any microprocessor-based device that monitors, controls, automates, and/or protects monitored equipment within a system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, motor drives, and the like. An IED may include systems to monitor electric signals sampled from the electric power fed to an electric motor and/or may include portions of a sensor system to monitor a location of a shaft (rotor) within a motor (e.g. relative to the stator).

IEDs may be connected to a network, and communication on the network may be facilitated by networking devices including, but not limited to, multiplexers, routers, hubs, gateways, firewalls, and switches. Furthermore, networking and communication devices may be incorporated in an IED or be in communication with an IED. The term "IED" may be used interchangeably to describe an individual IED or a system comprising multiple IEDs.

Aspects of certain embodiments described herein may be implemented as software modules or components. As used herein, a software module or component may include any type of computer instruction or computer-executable code located within or on a computer-readable storage medium. A software module may, for instance, comprise one or more physical or logical blocks of computer instructions, which may be organized as a routine, program, object, component, data structure, etc. that performs one or more tasks or implement particular abstract data types.

A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media.

Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network. In alternative embodiments, hardware and firmware may be utilized instead of software. For example, application specific control circuitry may be utilized to increase speed, efficiency, serviceability, and/or reduce maintenance costs.

Some of the infrastructure that can be used with embodiments disclosed herein is already available, such as: general-purpose computers, computer programming tools and techniques, digital storage media, and communications networks. A computer may include a processor, such as a microprocessor, microcontroller, logic circuitry, or the like. The processor may include a special-purpose processing device, such as an ASIC, PAL, PLA, PLD, CPLD, Field Programmable Gate Array (FPGA), or other customized or programmable device. The computer may also include a computer-readable storage device, such as non-volatile memory, static RAM, dynamic RAM, ROM, CD-ROM, disk, tape, magnetic, optical, flash memory, or other computer-readable storage medium.

FIG. 1 illustrates a simplified one-line diagram of an alternating current electric power transmission and distribution system 100, according to one embodiment. The electric power system 100 may generate, transmit, and distribute electric power to loads. Electric power systems may include equipment, such as electric generators (e.g., generators 110, 112, 114, and 116), power transformers (e.g., transformers 117, 120, 122, 130, 142, 144 and 150), power transmission and delivery lines (e.g., lines 124, 134, 136, and 158), circuit breakers (e.g., breakers 152, 160, 176), busses (e.g., busses 118, 126, 132, and 148), loads (e.g., loads 140, and 138) and the like. A variety of other types of equipment may also be included in the electric power delivery system 100, such as voltage regulators, capacitor banks, and a variety of other types of equipment known to those of skill in the art.

As illustrated, the substation 119 includes the generator 114 connected to the bus 126 through the step-up transformer 117. The bus 126 may be connected to the distribution bus 132 via the step-down transformer 130. Various distribution lines 136, 134 may be connected to the distribution bus 132. The distribution line 136 may lead to the substation 141 where the line is monitored and/or controlled using the IED 106, which may selectively open and close the breaker 152. The load 140 may be fed from the distribution line 136. An additional step-down transformer 144 in communication with the distribution bus 132 via the distribution line 136 may be used to step down a voltage for consumption by the load 140.

The distribution line 134 may lead to the substation 151 and deliver electric power to the bus 148. The bus 148 may also receive electric power from the distributed generator 116 via the transformer 150. The distribution line 158 may deliver electric power from the bus 148 to the load 138, and may include the additional step-down transformer 142. The circuit breaker 160 may be used to selectively connect the bus 148 to the distribution line 134. The IED 108 may be used to monitor and/or control the circuit breaker 160 as well as the distribution line 158.

The electric power delivery system 100 may be monitored, controlled, automated, and/or protected using IEDs, such as the illustrated IEDs 104, 106, 108, 115, and 170, and a central monitoring system 172. In general, IEDs in an electric power generation and transmission system may be used for protection, control, automation, and/or monitoring of equipment in the system (referred to generally in some instances as "monitoring" that may further include various protection, control, and/or automation actions). For example, IEDs may be used to monitor equipment of many types, including electric transmission lines, electric distribution lines, current transformers, busses, switches, circuit breakers, reclosers, transformers, autotransformers, tap changers, voltage regulators, capacitor banks, generators, motors, pumps, compressors, valves, and a variety of other types of monitored equipment. The IEDs may use the monitored information to perform or facilitate the performance of various protection, control, and/or automation schemas.

As used herein, an IED (such as IEDs 104, 106, 108, 115, and 170) may refer to any microprocessor-based device that monitors, controls, automates, and/or protects monitored equipment within the system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs.

A common time signal may be distributed throughout the system 100. Utilizing a common or universal time source may ensure that IEDs have a synchronized time signal that can be used to generate time synchronized data, such as synchrophasors. In various embodiments, the IEDs 104, 106, 108, 115, and 170 may receive a common time signal 168. The time signal 168 may be distributed in the system 100 using a communications network 162 or using a common time source, such as a Global Navigation Satellite System ("GNSS"), or the like.

According to various embodiments, the central monitoring system 172 may comprise one or more of a variety of types of systems. For example, the central monitoring system 172 may include a supervisory control and data acquisition (SCADA) system and/or a wide area control and situational awareness (WACSA) system. The central IED 170 may be in communication with the other IEDs 104, 106, 108, and 115. These other IEDs 104, 106, 108 and 115 may be remote from the central IED 170, and may communicate over various media, such as a direct communication from the IED 106 or over a wide-area communications network 162.

In various embodiments, the IEDs 104, 106, 108, 115, and 170 may be configured to monitor electrical power characteristics (e.g., frequency, voltage, current, etc.) of alternating current waveforms in the system 100. The measurements may be used in connection with the systems and methods disclosed herein for control of the system 100. The IEDs may utilize the common time source 168 to time-align measurements for comparisons across the system 100.

The network 162 may be used to transmit information among various components in the system 100, including the IEDs 108, 115, 170, and the central monitoring system 172. To increase reliability, the network 162 may include redundant communication paths between communicating devices. Such redundant paths may be selectively enabled when a first communication path is unavailable or disabled. The network 162 may include a variety of devices (e.g., multiplexers, routers, hubs, gateways, firewalls, switches, etc.) and technologies (e.g., connectionless communication network, SDN networks, etc.)

Measurements made by the IEDs 104, 106, 108, and 115 may be communicated to the central IED 170 and/or the central monitoring system 172. In some embodiments, one or more of the IEDs 108 and 115 may be configured to send a confirmatory signal through network 162 to the central IED 170. In the illustrated embodiment, the central IED 170 is in contact with the IEDs 108 and 115 via analog contact channels 180 and 182, respectively. In various embodiments, as noted in the illustrated embodiment, the IEDs 104, 106, 108, and 115 may include an integrated merging unit and/or be in communication with an external merging unit.

In several embodiments, the IEDs may obtain electric power delivery system signals via merging units. Merging units may be in electrical communication with primary equipment, such as, for example, CTs, PTs, and/or other measurement devices configured to measure one or more electrical power characteristic(s) at one or more points in the system 100. The merging units may be configured to receive electric power system signals directly from the measurement devices and create digitized electric power system signals for delivery to the IEDs. Such digitized electric power system signals may be digitized versions of original analog signals. These "digitized analog signals" may be packetized and transmitted to a subscribing IED. The merging units may communicate the digital samples to the subscribing IEDs as "sampled values" ("SVs").

As used herein, the term "sampled values" or "SVs" refers to any digital transmission of data via any of a wide variety of protocols and transmission media. Sampled values, as used herein, includes but is not limited to, the Sample Value Protocol defined in IEC 61850 environments and all subtypes, related protocols, and mappings (e.g., manufacturing message specification, generic object oriented substation events, sampled measured values, etc.). Thus, the term "sampled values" or "SVs" is intended to broadly encompass digital transmission of measured values using any of a wide variety of protocols, applications, transport types, network protocol types, and/or hardware types.

Merging units may further be configured to provide control signals to primary equipment on the electric power delivery system. For example, a merging unit may be in communication with a circuit breaker, and designed to open and/or close the circuit breaker upon receipt of a command from an IED.

Merging units may include an input for receiving electrical signals from CTs, PTs, or other measurement devices, and digitizing the electrical signals for use by IEDs. In some embodiments, merging units may comprise analog-to-digital converters to sample and digitize the incoming analog signals and provide the digitized signals. The merging unit may further comprise a processing module configured to organize the digitized signals into communication packets, and communicate the packetized digitized signals directly to a subscribing IED or via a communication system, such as an Ethernet switch, a relay, a router, or the like. As described below, a dynamic networking SV communicator may be used to transmit the packetized digitized signals to a subscribing IED and dynamically compensate for the loss of an SV stream from one or more merging units.

Figure 2A:
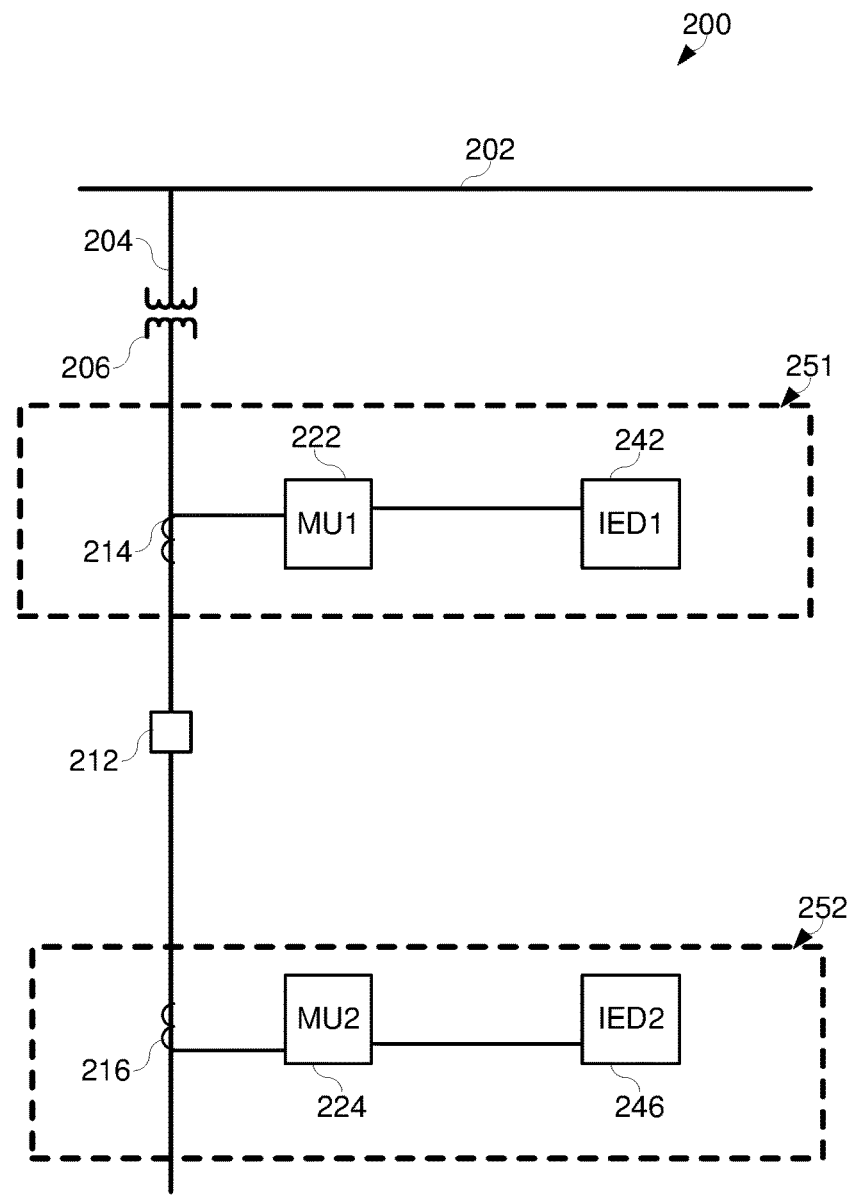
FIG. 2A illustrates a simplified one-line diagram of an example of a system for protecting an electric power system using merging units and intelligent electronic devices (IEDs).

FIG. 2A illustrates a simplified one-line diagram of a portion 200 of an electric power delivery system. As illustrated electric power delivery system may include a power line 202 and a feeder 204 connected thereto. The feeder 204 may include a transformer 206 configured to step down the electrical potential on the feeder 204. The feeder 204 may further include a circuit breaker 212 that may be configured to open and/or close on command, to disconnect or connect the remaining portion of the feeder 204 from downstream portions of the electric power delivery system. With breaker 212 closed, the feeder 204 may provide electrical power to a load. The illustrated IEDs 242, 246 may be used to monitor and protect the distinct portions of the electric power delivery system on the two sides of a circuit breaker 212.

Specifically, upstream monitoring may be provided by a first monitoring subsystem 251 that includes the first IED 242, and a first merging unit 222. The first merging unit 222 may obtain electric signals from the first (upstream) portion of the electric power delivery system using, for example, CT 214. The first merging unit 222 may obtain electric power signals using CT 214, sample and digitize the electric power system signals, packetize the digitized signals, and transmit the packets to the first IED 242. The first IED 242 may issue commands to the circuit breaker 212 (e.g., via a direct control line or via other components in the system).

Downstream monitoring may be provided by a second monitoring subsystem 252 that includes the second IED 246, and a second merging unit 224. The second merging unit 224 may obtain electric signals from the second (downstream) portion of the electric power delivery system using, for example, CT 216. The second merging unit 224 may obtain electric power signals using CT 216, sample and digitize the electric power system signals, packetize the digitized signals, and transmit the packets to the second IED 246. The second IED 246 issue commands to the circuit breaker 212 (e.g., via a direct control line or via the second merging unit 224 and second communications switch 233).

As illustrated, failure of a component in either of the first monitoring subsystem 251 or the second monitoring subsystem 252 may prevent the impacted subsystem from functioning. As a specific example, if the CT 214 or the first merging unit were to fail, then the first IED 242 would not be able to perform its monitoring, protection, and/or control functions.

To increase the reliability of electric power system monitoring and protection systems, redundancy is often built in to the protection systems. Various components of the system may be subject to failure, which, if redundancy is not designed into the system, may leave portions of the electric power system without adequate monitoring or protection. Merging units, for example, require several components such as power supplies, A/D converters, input and output communication hardware, a processing module, firmware, and the like.

Failure of any of these components may result in failure of the merging unit itself to provide the required digitized electrical signals to the appropriate IED. Furthermore, failure of the primary electrical signal measuring equipment such as CTs, PTs, or the like may result in failure of the merging unit to provide the accurate digitized electrical signals to the appropriate IED. Further still, failure in the communications between the merging unit and the communication system (by, for example, failure of a communication cable, unplugged cable, failure of a communication port, etc.) may result in failure of the merging unit itself to provide the required digitized electrical signals to the appropriate IED. One solution to provide additional redundancy is to add secondary or backup CTs and/or merging units to each monitoring subsystem.

Figure 2B:
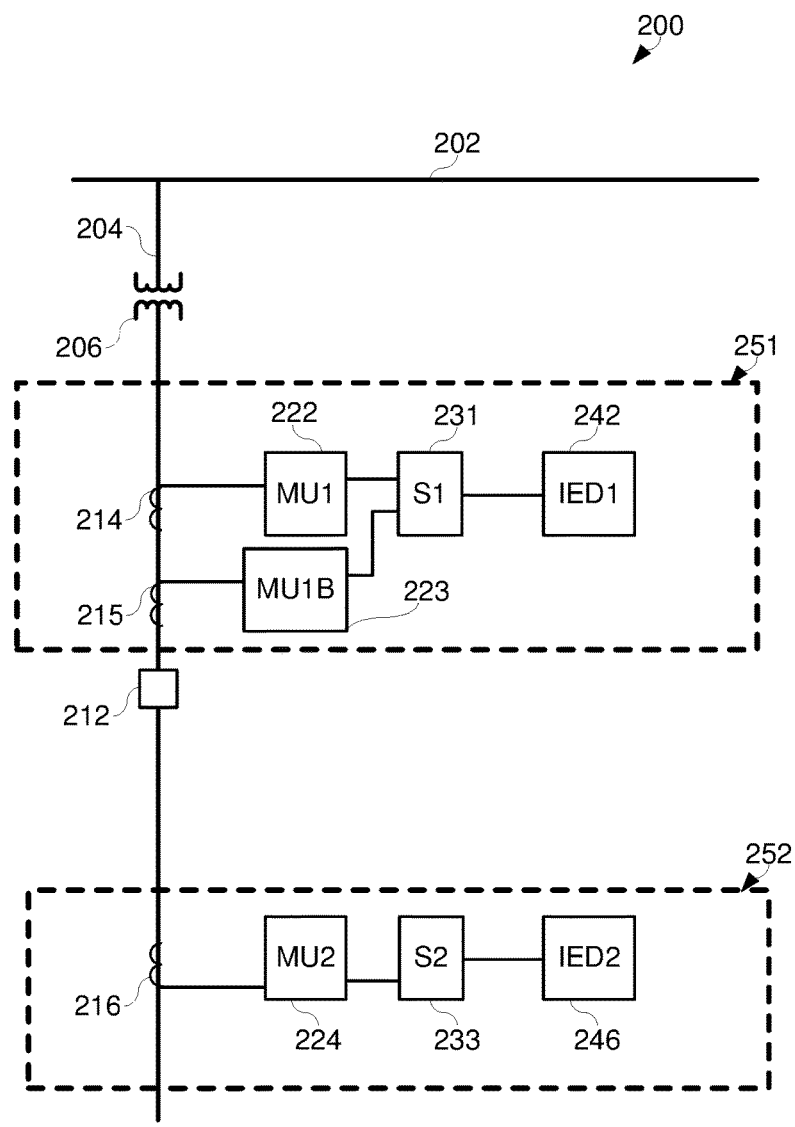
FIG. 2B illustrates an embodiment of a protection system in which a first monitoring subsystem includes a redundant, backup current transformer (CT).

FIG. 2B illustrates an embodiment in which the first monitoring subsystem 251 includes a redundant, backup CT 215 and a redundant, backup merging unit 223 (MU1B). While this system provides increased redundancy for monitoring subsystem 251, such a solution increases the cost of the system, increases the total number of components in the system that require maintenance, and/or increases the complexity of the system. Furthermore, retrofit installation of the backup CT 215 may be difficult or impractical to install.

Figure 3:
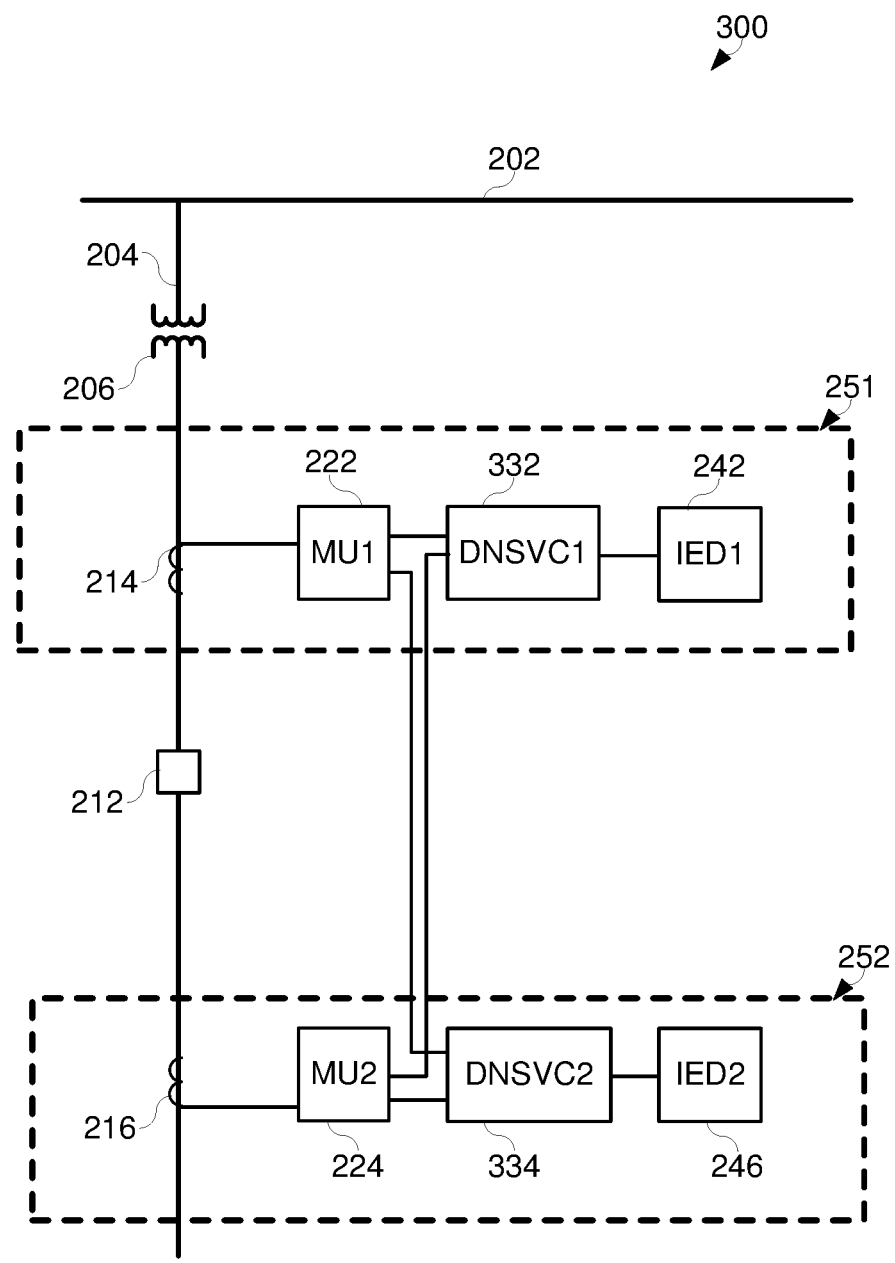
FIG. 3 illustrates a simplified one-line diagram of an example of an electric power transmission and distribution system.

FIG. 3 illustrates a simplified one-line diagram of the portion 300 of an electric power delivery system and IEDs 242 and 246 that may be used to monitor and protect the portion 200 of the electric power delivery system. Many components are similar to those described in conjunction with FIGS. 2A and 2B. As illustrated, the feeder 204 may be monitored and protected by the first monitoring subsystem 251 that includes the first IED 242, and a second monitoring subsystem 252 that includes the second IED 246.

As illustrated, the first dynamic networking SV communicator 332 is in communication with the first merging unit 222 and the second merging unit 224 to obtain the digitized electric power system signals therefrom. Similarly, the second dynamic networking SV communicator 334 is in communication with the second merging unit 224 and the first merging unit 222 to obtain digitized electric power system signals therefrom. During normal operating conditions, the first dynamic networking SV communicator 332 may distribute the digitized electric power system signals from the first merging unit 222 to the first IED 242. During normal operating conditions, the second dynamic networking SV communicator 334 may distribute the digitized electric power system signals from the second merging unit 224 to the second IED 246.

With circuit breaker 212 closed, the electric power system signals obtained by the CT 214 and the CT 216 are theoretically identical and practically equivalent. Thus, with circuit breaker 212 closed, electric power system signals from either side of the switch may be used to monitor and protect both sides of the switch 212. In such a configuration, if communication is lost from the first merging unit 222, the first dynamic networking SV communicator 332 may utilize sampled values from the second merging unit 224 as a backup source. Similarly, if communication is lost from the second merging unit 224, the second dynamic networking SV communicator 334 may utilize sampled values from the first merging unit 222.

As described above, the use of dynamic networking SV communicators allows for existing primary components to be used as redundant sources in the event of a failure in a separate subsystem. A more traditional redundancy approach, as shown in FIG. 2B, requires the addition of secondary or backup components. However, dynamic networking SV communicators leverage "latent" redundancy in the system to provide increased reliability and uptime of monitoring subsystems and IEDs without additional components, such as additional CTs or merging units.

In various embodiments, a communications system may determine which sampled value stream to provide to which subscribing IED based on an instruction from a subscribing IED. For example, under normal operating conditions, the first IED 242 may instruct the first dynamic networking SV communicator 332 to provide sampled values from the first merging unit 222; and the second IED 246 may instruct the second dynamic networking SV communicator 334 to provide sampled values from the second merging unit 224. Upon detection of a loss of signal or other failure to obtain sampled values from the first merging unit 222, the first IED 242 (or a supervisory coordination IED) may determine a coordination of the first and second portions of the electric power delivery system, and instruct the first dynamic networking SV communicator 332 to provide sampled values from the second merging unit 224 thereto. In such an embodiment, the decision is made by subscribing IED instead of the communication system (dynamic networking SV communicator 332 and/or dynamic networking SV communicator 334).

Figure 4A:
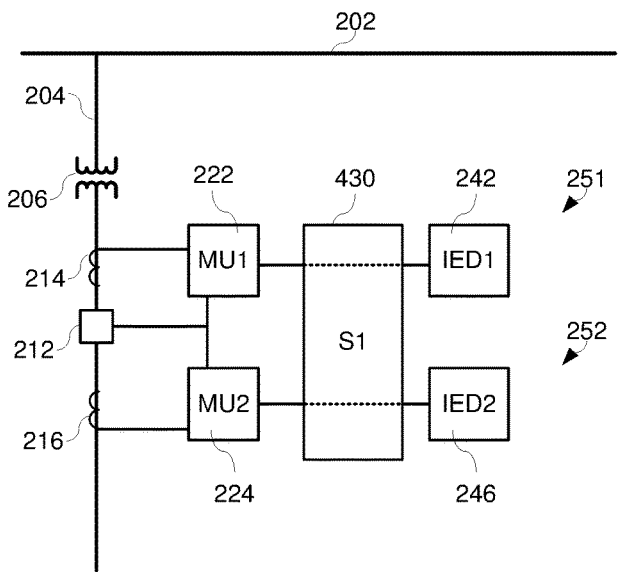
FIG. 4A illustrates a one-line diagram of a power system with a communication system that includes a single dynamic networking SV communicator.

FIG. 4A illustrates a one-line diagram of a power system with a communication system that includes a single, integrated dynamic networking SV communicator 430 in communication with each of the first and second merging units 222, 224, and each of the first and second IEDs 242, 246. Under normal operating conditions, the dynamic networking SV communicator is configured to communicate the digitized electric power system signals received from the first merging unit 222 to the first IED 242, and communicate the digitized electric power system signals received from the second merging unit 224 to the second IED 246. In the event that one merging unit 222, 224 or CT 214, 216 fails, the dynamic networking SV communicator 430 may dynamically route SV data from the other merging unit 222, 224. The dynamic networking SV communicator 430 may identify a failed merging unit or CT based on a loss of signal or an explicit failure notification. In some embodiments, the dynamic networking SV communicator 430 may not be able to distinguish between a failed merging unit and a failed CT, but simply determine that sampled values are no longer being provided.

Figure 4B:
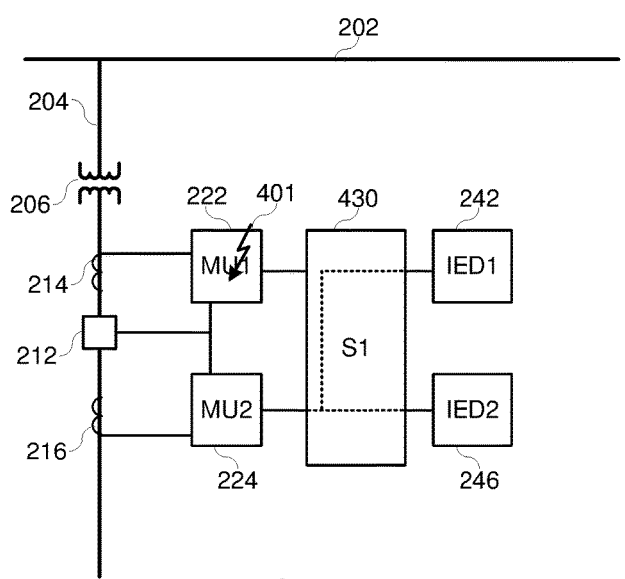
FIG. 4B illustrates a one-line diagram of the power system in a failure state with SV signals dynamically rerouted via the dynamic networking SV communicator.

FIG. 4B illustrates a one line diagram of the power system in which electric power system signals are routed by the dynamic networking SV communicator 430 to both the first and second IEDs 242, 246 under a failure of the merging unit 222, at 401. In the illustrated embodiment, the first merging unit 222 has experienced a failure. That is, either the merging unit 222 has failed, the CT 214 has failed, communication between the CT 214 and the merging unit 222 has failed, and/or communication between the merging unit 222 and the dynamic networking SV communicator 430 has failed.

In some embodiments, the dynamic networking SV communicator 430 may automatically determine that the digitized electric power system signals from the merging unit 222 are not being received. In some embodiments, the dynamic networking SV communicator 430 may determine that the circuit breaker 212 is closed. Based on the loss of the digitized electric power system signals from the merging unit 222 and the confirmation that the circuit breaker 212 is closed, the dynamic networking SV communicator 430 may route SV data from the merging unit 224 to both IEDs 242, 246.

In some embodiments, the dynamic networking SV communicator 430 may determine a polarity change caused by the circuit breaker 212 or another electrical device between the upstream CT 214 and the downstream CT 216. The dynamic networking SV communicator 430 may correct or compensate for any polarity differences. Alternatively, the dynamic networking SV communicator 430 may indicate to the IED 242 receiving the rerouted SV data from the merging unit 224 that the SV data is from an alternative source (the downstream CT 216), has a reversed polarity, and/or that some sampled values may be anomalous or even missing as a result of the rerouting.

As provided above, even with the loss of signal from one CT 214 or merging unit 222, the first and second IEDs 242, 246 can continue to provide monitoring and protection functions to the electric power delivery system. The IEDs 242 and 246 can continue uninterrupted as if receiving digitized electric power system signals from the default or normal merging units or with minimal interruption with sufficient information to compensate for any polarity changes.

In some embodiments, the dynamic networking SV communicator 430 is configured to indicate to the first IED 242 that it is receiving a temporary signal, such as a signal from the second merging unit 224. As described above, the dynamic networking SV communicator 430 may modify the polarity of the signal from the second merging unit 224 to more consistently (or even exactly) match the expected signal from the first merging unit 222. For example, the voltages and/or currents as measured from one side of the circuit breaker 212 may be reverse polarity from the currents as measured from the other side of the circuit breaker 212.

In some embodiments, other intermediary electrical devices (other than breakers), such as fuses, diodes, transformers, etc., may modify the electrical power in a different manner and appropriate compensation can performed by the dynamic networking SV communicator 430 and/or by the IED 242. Returning to the illustrated example, when transmitting currents from the downstream side of the circuit breaker 212, the dynamic networking SV communicator 430 may be configured to modify the polarities thereof.

Figure 5A:
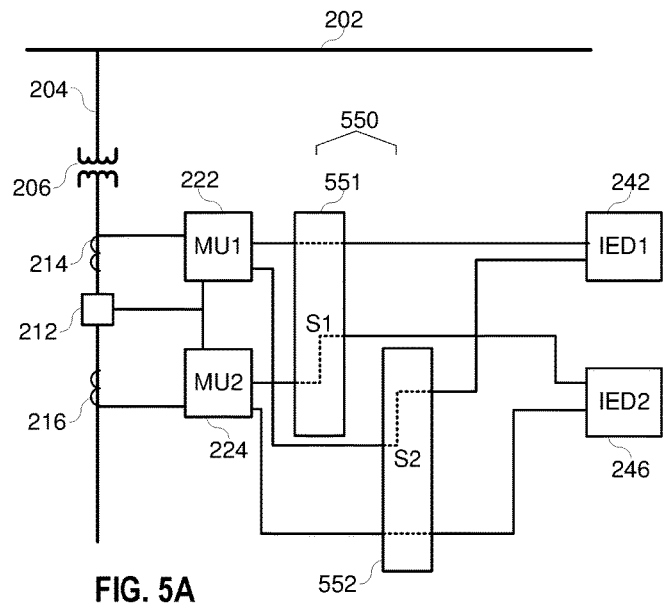
FIG. 5A illustrates a one-line diagram of a power system with a dynamic networking SV communicator in communication with two merging units.

FIG. 5A illustrates a system similar to that of FIGS. 4A and 4B, except that a communication system 550 includes a first dynamic networking SV communicator 551 and a second dynamic networking SV communicator 552. The first dynamic networking SV communicator 551 is shown in communication with both the first and second merging units 222, 224 and the first and second IEDs 242, 246. The second dynamic networking SV communicator 552 is also shown in communication with both the first and second merging units 222, 224 and the first and second IEDs 242, 246.

Under normal operating conditions, the first dynamic networking SV communicator 551 provides communications from the first merging unit 222 to the first IED 242, and communications from the second merging unit 224 to the second IED 246. Concurrently, the second dynamic networking SV communicator 552 provides communications from the second merging unit 224 to the second IED 246, and communications from the first merging unit 222 to the first IED 242.

The communications system 550 may modify the operation upon a determination or notification that circuit breaker 212 is open. In various embodiments, the redundant routing of SV data from both merging units 222, 224 ensures that both IEDs 242 and 246 receive the SV data from CTs 214 and 216 to perform monitoring and/or protection functions.

Figure 5B:
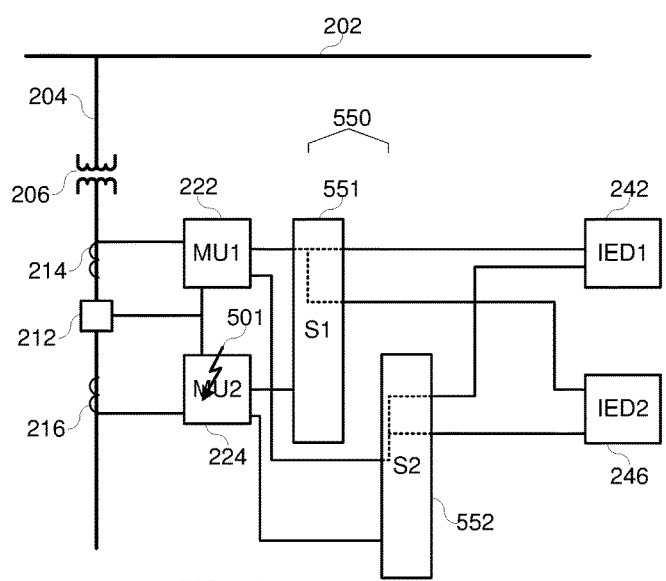
FIG. 5B illustrates the power system of FIG. 5A in a failure state with SV signals dynamically rerouted via the dynamic networking SV communicator.

FIG. 5B illustrates the system of FIG. 5A, in a failure situation, at 501. Specifically, the second merging unit 224 has failed or at least failed to provide a signal to one or both of the dynamic networking SV communicators 551,552. Such a failure may be due to, for example, a fault 501 on the second merging unit 224. In such a failure, the first and second dynamic networking SV communicators 551,552 may supply the digitized electric power system signals from the first merging unit 222 to each of the first and second IEDs 242, 246.

Figure 5C:
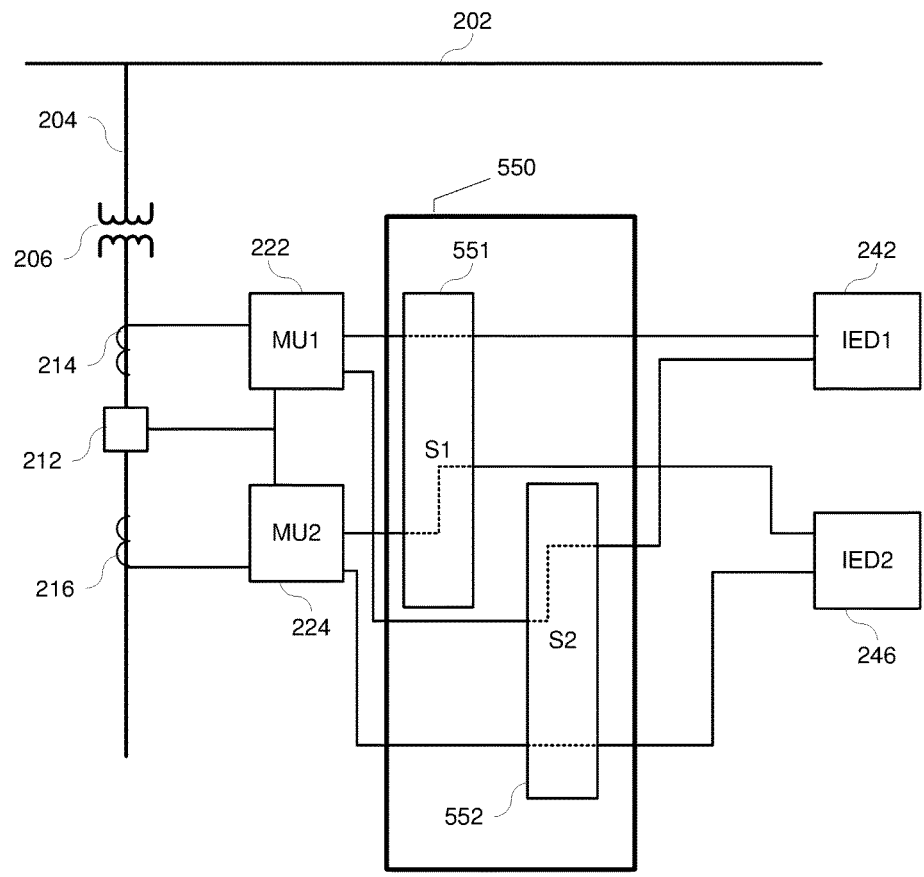
FIG. 5C illustrates the power system of FIG. 5A with a single communications system that includes multiple dynamic networking SV communicators.

FIG. 5C illustrates a system similar to the one illustrated FIGS. 5A and 5B, except that communications system 550 is a single unit that includes the first dynamic networking SV communicator 551 and a second dynamic networking SV communicator 552. In such an embodiment, the IEDs and their respective functions may be separate, but share a common communications system 550.

Figure 6A:
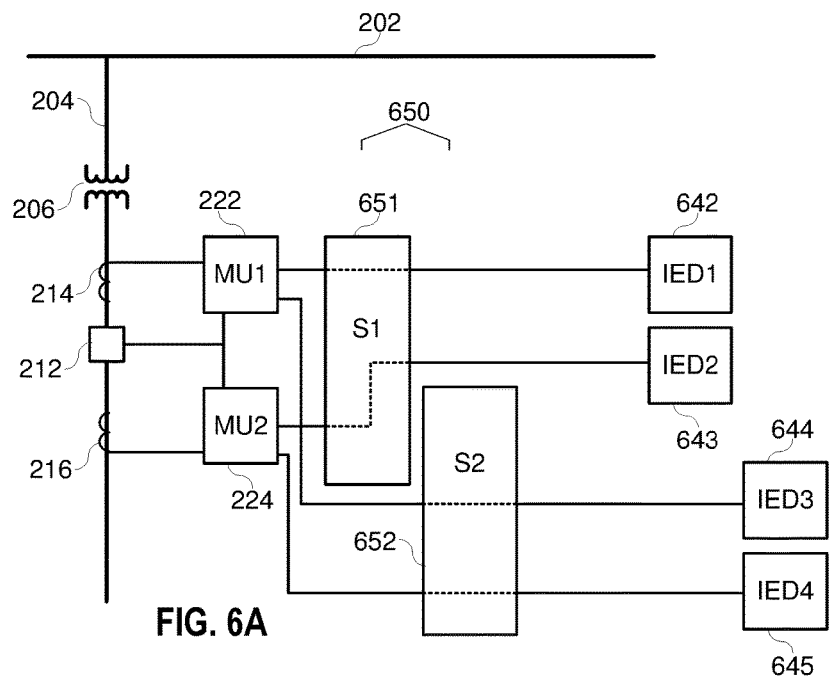
FIG. 6A illustrates another embodiment of a system for monitoring and protecting a power delivery system.

FIG. 6A illustrates yet another embodiment of a system for monitoring and protection of an electric power delivery system in accordance with several embodiments herein. The illustrated system includes a communication system 650 with two distinct dynamic networking SV communicators 651 and 652. In some embodiments, the communication system 650 may be a single device with dual internal dynamic networking SV communicator devices or, alternatively, a single device that functionally performs the tasks of one or more dynamic networking SV communicator devices.

As illustrated, upstream monitoring in a default fully functional state is provided via the CT 214, the merging unit 222, the dynamic networking SV communicator 651, and dual redundant IEDs 642, 643. Similarly, downstream monitoring in a default fully functional state is provided via the CT 216, the merging unit 224, the dynamic networking SV communicator 652, and dual redundant IEDs 644, 645.

In the illustrated embodiment, the IED 642 and the IED 644 are configured to monitor and protect a portion or portions of the electric power delivery system using digitized analog signals obtained from the merging unit 222. The IED 643 and the IED 645 are configured to monitor and protect a portion or portions of the electric power delivery system using digitized analog signals obtained from the merging unit 224. Each dynamic networking SV communicator 651, 652 receives digitized analog signals from each of the merging units 222, 224. Under normal operating conditions, the dynamic networking SV communicator 651 provides digitized analog signals obtained using the merging unit 222 to the IEDs 642, 644; and the dynamic networking SV communicator 652 provides digitized analog signals obtained using the merging unit 224 to the IEDs 643, 645.

Figure 6B:
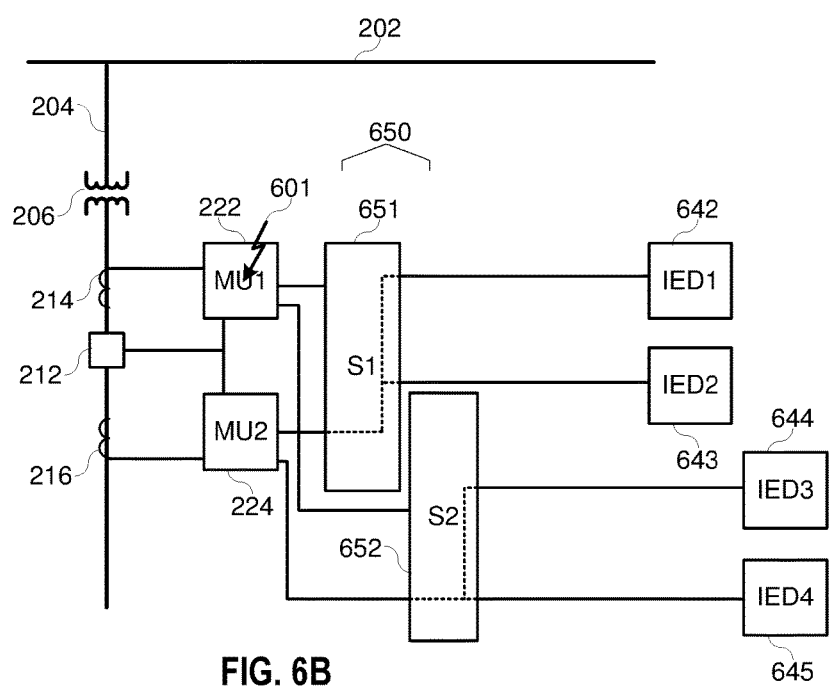
FIG. 6B illustrates the failure of merging unit in the system of FIG. 6A and the dynamic routing of SV data via the dynamic networking SV communicator.

FIG. 6B illustrates a failure of the merging unit 222, at 601. As illustrated, the dynamic networking SV communicator devices 651 and 652 of the communication system 650 dynamically route data from the merging unit 224 to each of the IEDs 642, 643, 644, and 645. Such a configuration allows for dynamically provided redundancy from existing components in the system. As with other embodiments herein described, the communication system 650 and/or one or both of the dynamic networking SV communicator devices 651 and 652 may determine or receive a notification that the electrical conditions on the portion of the electric power system upstream from the circuit breaker 212 and the portion of the electric power system downstream from the circuit breaker 212 are coordinated or substantially similar. In one embodiment, this determination may be made by ensuring, measuring, or determining that the circuit breaker 212 is closed. As before, it is appreciated that the circuit breaker 212 is merely an example and could be any of a wide variety of alternative devices, such as a switch or fuse.

Figure 7A:
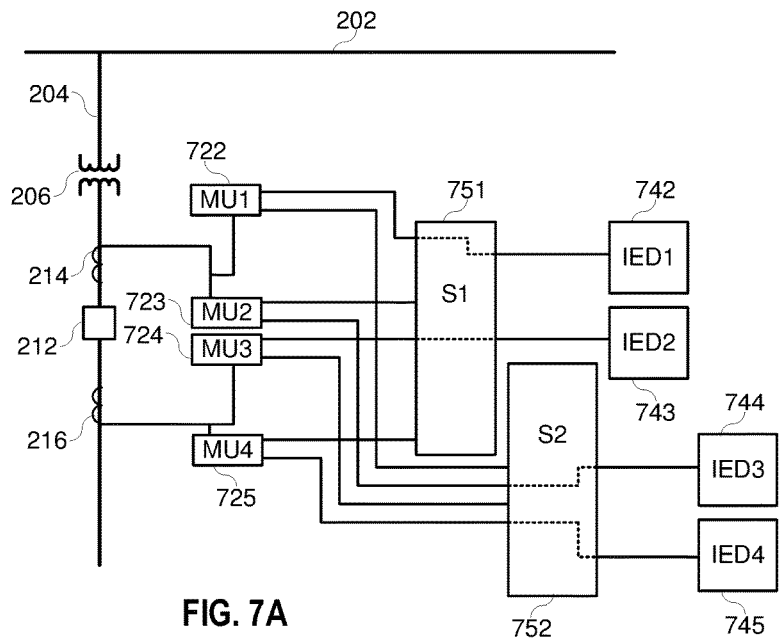
FIG. 7A illustrates another embodiment of a protection system for a power delivery system with multiple redundant components.

FIG. 7A illustrates yet another system configured for additional redundancy, that includes redundant merging units 722, 723, 724, 725; redundant dynamic networking SV communicators 751,752; and redundant IEDs 742,743,744, 745. As illustrated, first and second merging units 722, 723 obtain electric power signals from a first portion of an electric power delivery system, and provide sampled values to both dynamic networking SV communicators 751, 752. Third and fourth merging units 724, 725 obtain electric power signals from the second portion of the electric power delivery system and provide sampled values to both dynamic networking SV communicators 751, 752. The first dynamic networking SV communicator 751 is in communication with the first and second IEDs 742, 743; and the second dynamic networking SV communicator 752 is in communication with the third and fourth IEDs 744, 745.

Under normal operating conditions, the sampled values from the first portion of the electric power system are communicated to the first and third IEDs 742, 744; and the sampled values from the second portion of the electric power system are communicated to the second and fourth IEDs 743, 745. In one embodiment, as illustrated, the sampled values from the first merging unit 722 are communicated to the first IED 742 using the first dynamic networking SV communicator 751; the sampled values from the third merging unit 724 are communicated to the second IED 743 using the first dynamic networking SV communicator 751; the sampled values from the second merging unit 723 are communicated to the third IED 744 using the second dynamic networking SV communicator 752; and, the sampled values from the fourth merging unit 725 are communicated to the fourth IED 745 using the second dynamic networking SV communicator 752.

Figure 7B:
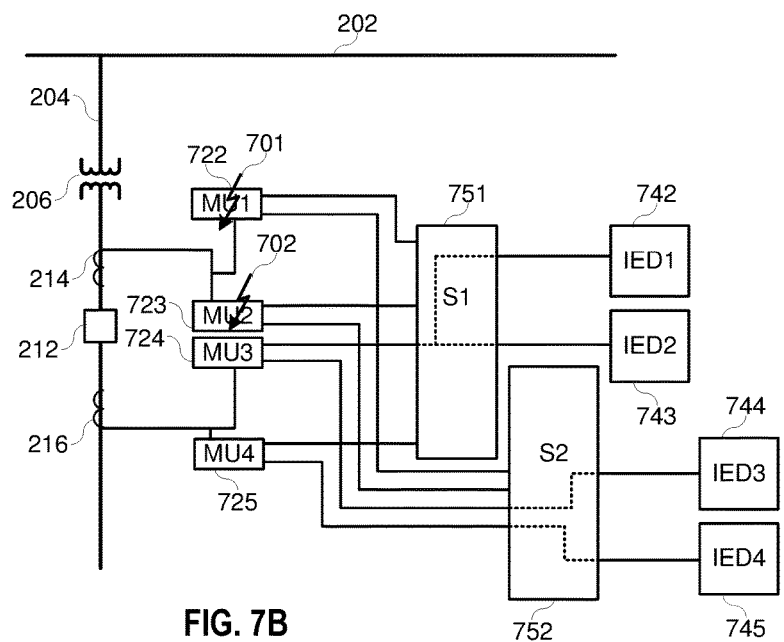
FIG. 7B illustrates a failure state of the system illustrated in FIG. 7A and the dynamic routing of SV data via the dynamic networking SV communicator.

As illustrated in FIG. 7B, in an instance where the sampled values from the first, and second merging units 722, 723 are unavailable (due to, for example, faults 701, 702), the first dynamic networking SV communicator 751 is configured to route the sampled values from the third and/or fourth merging units 724,725 to the first and second IEDs 742, 743. The second dynamic networking SV communicator 752 may route the sampled values from the third and/or fourth merging units 724, 725 to the third and fourth IEDs 744, 746.

In many of the embodiments described herein the dynamic networking SV communicators may receive data directly from measurement devices, such as CTs, PTs, and other measurement devices. In such embodiments, the data may be analog or digital. The raw data may be routed by the dynamic networking SV communicator to one or more IEDs. In some embodiments, the IEDs may process the raw data and/or convert analog data to a digital format. In some embodiments, a dynamic networking SV communicator, or communication system that includes multiple dynamic networking SV communicators, may include one or more analog-to-digital (A/d) converters to convert analog data from measurements into a digital format for transmission to one or more IEDs.

Figure 7C:
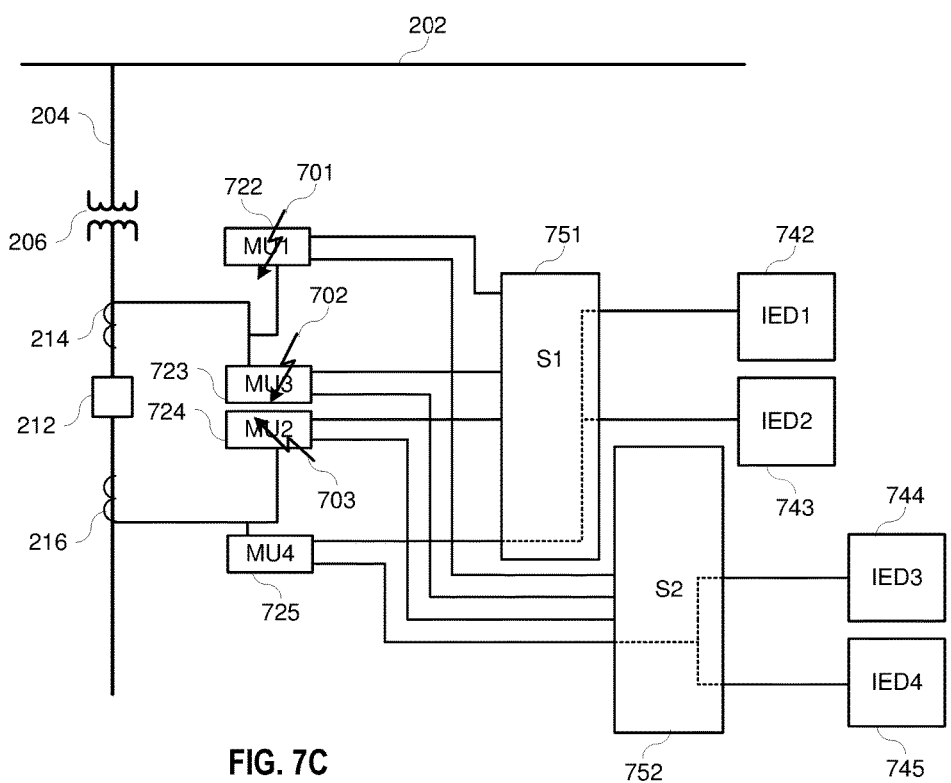
FIG. 7C illustrates an instance in which three merging units of the system in FIG. 7A have failed.

FIG. 7C illustrates in an extreme instance where the sampled values from all of the first, second, and third merging units 722, 723, 724 are unavailable (due to, for example, faults 701, 702, 703), the first dynamic networking SV communicator 751 is configured to route the sampled values from the fourth merging unit 725 to the first and second IEDs 742, 743; and the second dynamic networking SV communicator 752 is configured to route the sampled values from the fourth merging unit 725 to the third and fourth IEDs 744, 745, similar to the several embodiments described herein.

Figure 8:
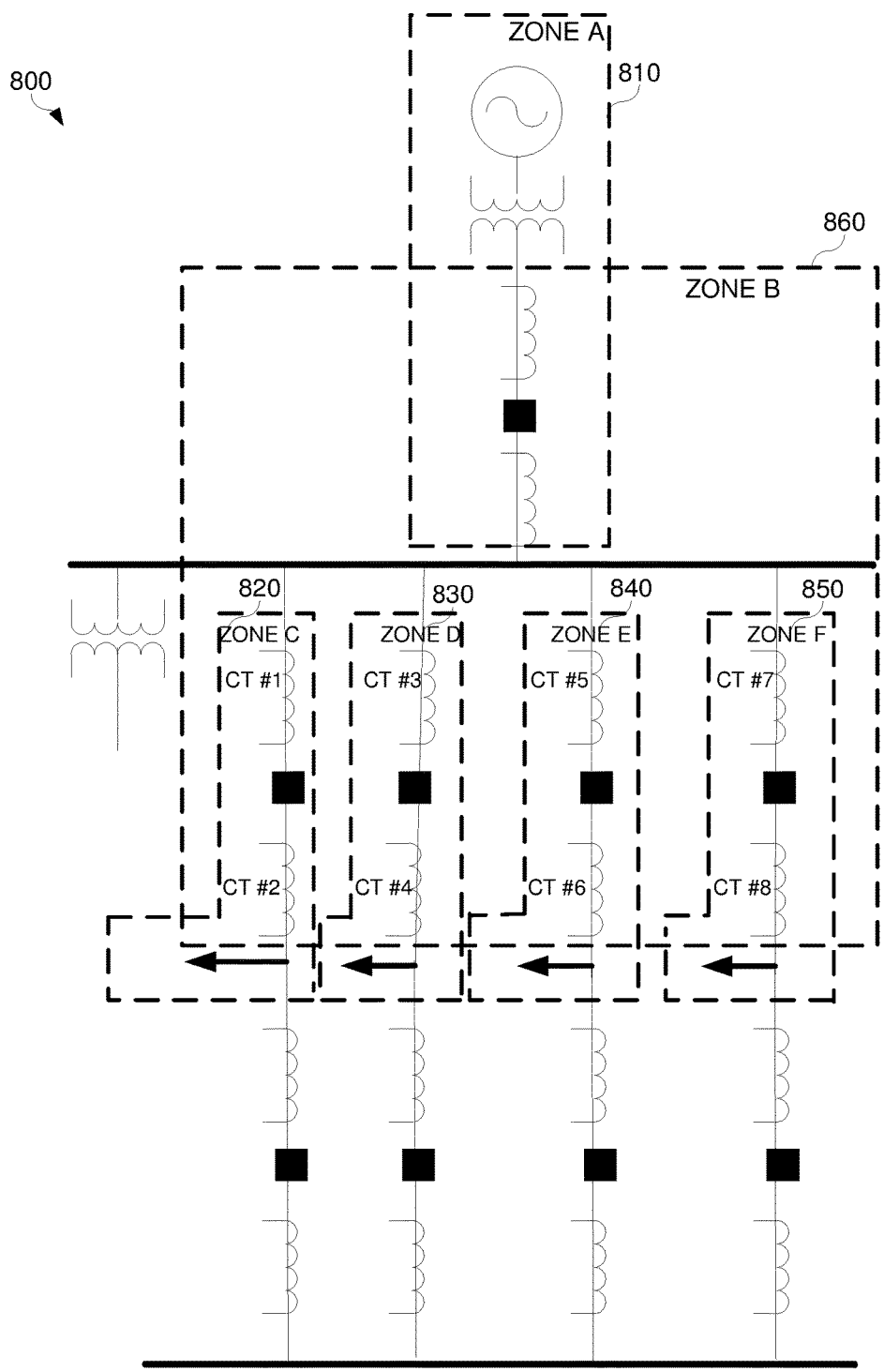
FIG. 8 illustrates an embodiment of a power system with several overlapping zones, each of which is monitored by a distinct IED.

FIG. 8 illustrates an embodiment of a power system with several overlapping zones, each of which may be monitored by a distinct IED. In the illustrated embodiment, each of zones A, C, D, E, and F (810, 820, 830, 840, 850) are protection zones and each of these zones includes at least one CT. Zone B (860) is a protection zone that overlaps with zones A, C, D, E, and F. Accordingly, to various embodiments, each of the CTs may be connected to a merging unit which provides sampled values to one or more protective IEDs.

Figure 9:
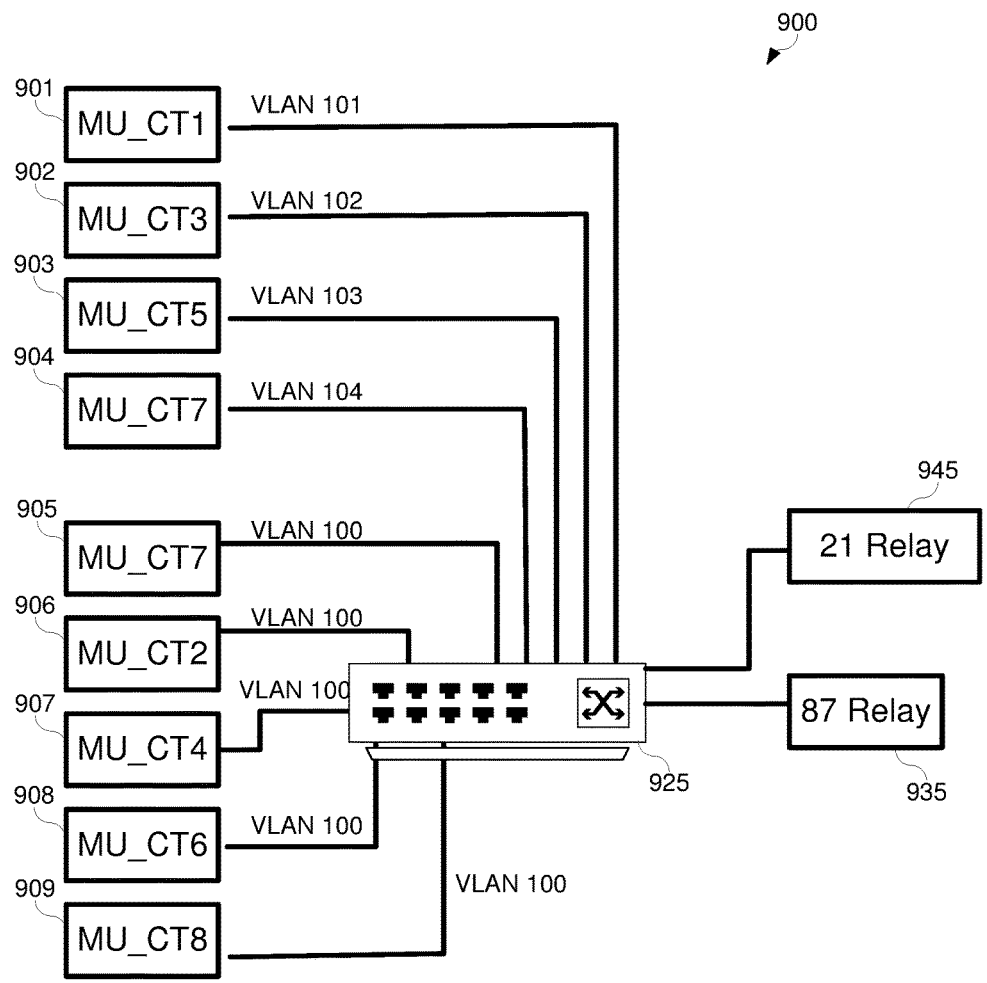
FIG. 9 illustrates a partial network diagram for bus differential protection, according to one embodiment.

FIG. 9 illustrates a partial network diagram for bus differential protection and/or line protection of the system illustrated in FIG. 8. The illustrated communication system 925 includes one or more dynamic networking SV communicators to receive sampled values from the merging units 901-909 (MU_CTs1-8) that receive electric power system signals from corresponding CTs in FIG. 8. Sampled values from the merging units 901, 902, 903, 904 in communication with CTs 1, 3, 5, and 7 are given VLANs 101, 102, 103, and 104, respectively. For example, CT1 in FIG. 8 is connected to merging unit MU_CT1 901 in FIG. 9. In protection zone B (FIG. 8, 860), an 87 relay 935 uses SV data from MU_CT7 905, MU_CT2 906, MU_CT4 907, MU_CT6 908, and MU_CT8 909.

Line protection for zone C is protected by a distance or overcurrent relay 945. The distance relay 945 uses the SV stream from MU_CT1 901. If one of the merging units that serves data to the 87 SV relay 935 is not functioning properly, or the fiber optic cables are damaged, the 87 protection relay 935 is disabled and the bus is not protected. However, using the embodiments described herein, the 87 relay 935 can instantaneously begin using an SV stream from MU_CT1 901 instead of MU_CT2 906, even if it is on a different VLAN.

As an example, the SV stream from MU_CT7, MU_CT2, MU_CT4, MU_CT6, and MU_CT8 (905-909) are on VLAN 100. The MU_CT1 901 is on VLAN 101. However, if the communications system 925 detects a link is lost or the SV stream is lost from MU_CT2 906, the switch will route the SV stream from MU_CT1 901 to the port (e.g., Ethernet) where the 87 relay 935 is connected. The dynamic networking SV communicator(s) of the communication system 925 can dynamically route SV data from any of the merging units 901-909 to any IED (e.g., 21 relay 945 or 87 relay 935).

In some embodiments, the communication system 925 routes both SV streams from MU_CT1 901 and MU_CT2 906 to the port where the 87 relay 935 is connected. The 87 relay 935 actively discards the SV stream from MU_CT1 901. However, if the 87 relay 935 detects that the SV data from MU_CT2 906 is lost, the 87 relay 935 will begin using the data from the second configured VLAN 101. Thus, the relay bus differential protection from 87 relay 935 continues to operate.

In several embodiments, the communication system 925 may be configured to revert back to providing the originally appropriate sampled value stream to the subscribing IED (935 or 945) when such stream is available. The sampled value stream from the communication switch may include unique fields such as a source data field. The data source field may be used to indicate a source of the data. The data source may indicate the merging unit providing the data. The field may be multiple bits such that the merging unit may be positively identified. In other embodiments, the data field may be binary, where a set bit may indicate that the data originates from a backup source such as different merging unit than the default merging unit. In various embodiments, the sampled value stream may be a configured subscription. In several embodiments, the subscribing IED may be configured to notify a central IED (such as central IED 170 of FIG. 1) to indicate when the data provided to the IED is from a different source, such as when the data source field indicates that the sampled values are from a different merging unit.

As indicated above, the communication system may be configured to perform certain calculations or operations on the sampled value stream that is provided to the subscribing IED upon loss of a sampled value stream. In one embodiment, the communication system may simply notify the subscribing IED of the change in sampled value stream, whereupon the subscribing IED may perform the necessary calculations for proper use of the alternate sampled value stream.

Figure 10:
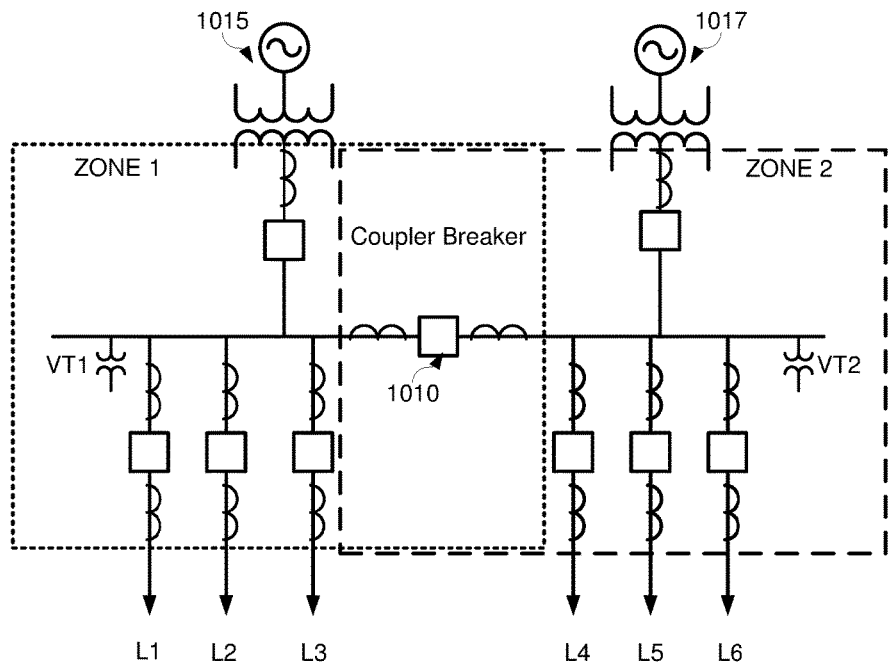
FIG. 10. Illustrates an embodiment of a power system comprising two overleaping zones of protection.

FIG. 10 illustrates one embodiment of a power system comprising a left half with loads L1, L2, and L3 and a right half with loads L4, L5, and L6. A circuit breaker 1010 acts to couple the left and right half together in normal conditions and/or based on a failure of one of the generators 1015 and 1017. The power system is further divided into a first zone of protection (Zone 1) and a second zone of protection (Zone 2) that overlap on the circuit breaker 1010. Zone 1 bus differential is supervised by VT1. Zone 2 bus differential is supervised by VT2. Each Voltage transformer is connected to a merging unit to produce a SV stream for delivery to an IED.

Figure 11:
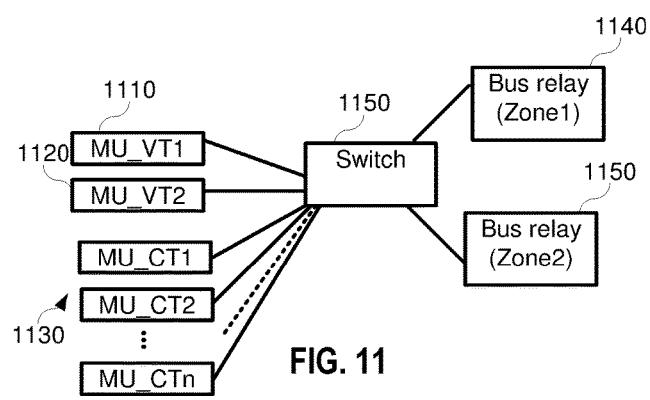
FIG. 11 illustrates a network diagram of the protection system for the power system of FIG. 10.

FIG. 11 illustrates the network connection diagram of the protection system of FIG. 10. MU_VT1 1110 (the merging unit in communication with VT1) and MU_VT2 1120 (the merging unit in communication with VT2) are both connected to a communication system that may include one or more dynamic networking SV communicators and is labeled as switch 1150. MU_VT1 1110, under normal operations, publishes the SV stream into the switch 1150 and it is made available to only Bus relay 1140. MU_VT2 1120, under normal operations, publishes the SV stream into the switch and it is available to only the Bus relay 1150.

However, when there is a failure of transmitting VT1 voltage signals via Sampled Values streams, from MU_VT1 1110 to the subscribing IED, bus relay 1140, the switch 1150 will automatically and dynamically route VT2 voltage information from MU_VT1 1120 into the Bus relay 1140 (and other subscribing IEDs, if any). Accordingly, the system provides redundant SV streams using existing hardware. That is, the system provides redundancy of measured values, such as those provided in SV streams, without redundant components.

The protection and control operations on bus relay 1140 may be supervised by configuration conditions. For instance, the bus relay 1140 is supervised by the status of the bus coupler, i.e., breaker 1010 in FIG. 10. If the breaker 1010 is open, the bus relay 1140 will not start using the SV stream coming from MU_VT1 1120, even though the switch 1150 has routed such information. Alternatively, the switch 1150 may not route the SV stream from MU_VT 1120 if the breaker 1010 is open.

In many embodiments, the communication system may be supervised by the subscribing IED as to which sampled value stream it will receive. For example, the subscribing IED may be configured to detect the loss of the primary sampled value stream, and command the communication switch to provide an alternate sampled value stream. The IED may further perform correction calculations, such as polarity changes or CT ratios changes to the newly-received sampled value stream, or instruct the communication switch to perform such calculations to correct the alternate sampled value stream before transmitting such to the subscribing IED. The subscribing IED may use supervision conditions such as hardwired contact input status, or block signals to supervise its protection and control functions. Alternatively, such signals may be from GOOSE messages or other communications signals.

In one embodiment, herein, the subscribing IED may be configured to generate messages, alarms, reports, event reports, or the like indicating a change in sampled value streams from the primary source to an alternate source. Such messages, alarms, reports, event reports, or the like may be communicated to an operator via a communication system. Such may be saved in the subscribing IED for future retrieval. Such may be stored or communicated as COMTRADE reports.

In some embodiments, the communication switch may be configured to determine whether switching from a primary sampled value source to an alternate sampled value source for providing sampled values to a particular subscribing IED may be performed. In such embodiments, the communication switch may receive supervision from GOOSE or other communication messages, hardwired signals, or the like to determine sampled value stream routing dynamically.

While specific embodiments and applications of the disclosure are described above, it is to be understood that the disclosure is not limited to the precise configurations and components disclosed herein. For example, the systems and methods described herein may be applied to an industrial electric power delivery system or an electric power delivery system implemented in a boat or oil platform that may not include long-distance transmission of high-voltage power. Accordingly, many changes may be made to the details of the above-described embodiments without departing from the underlying principles of this disclosure.

Any methods disclosed herein include one or more steps or actions for performing the described method. The method steps and/or actions may be interchanged with one another. In other words, unless a specific order of steps or actions is required for proper operation of the embodiment, the order and/or use of specific steps and/or actions may be modified and/or steps or actions may be omitted.

In some cases, well-known features, structures, or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations. Thus, all feasible permutations and combinations of embodiments are contemplated.

Several aspects of the embodiments described may be implemented using hardware, firmware and/or software modules or components. As used herein, a module or component may include various hardware components, firmware code, and/or any type of computer instruction or computer executable code located within a memory device and/or transmitted as transitory or non-transitory electronic signals over a system bus or wired or wireless network.

In the description above, various features are sometimes grouped together in a single embodiment, figure, or description thereof for the purpose of streamlining the disclosure. This method of disclosure, however, is not to be interpreted as reflecting an intention that any claim requires more features than those expressly recited in that claim. Rather, as the following claims reflect, inventive aspects lie in a combination of fewer than all features of any single foregoing disclosed embodiment. Thus, the claims are hereby expressly incorporated into this Detailed Description, with each claim standing on its own as a separate embodiment. This disclosure includes all permutations and combinations of the independent claims with their dependent claims.

What is claimed is:

1. A communication system for dynamically routing power system signals from measurement devices to intelligent electronic devices (IEDs), comprising:
   a sampled values (SV) communicator that includes:
      a first communication port to receive power system signals corresponding to measurements made by a first measurement device within a first portion of an electric power delivery system;
      a second communication port to output the power system signals from the first measurement device to a first IED configured to monitor the first portion of the electric power delivery system using received power system signals;
      a third communication port to receive power system signals corresponding to measurements made by a second measurement device within a second portion of the electric power delivery system;
      a fourth communication port to output the power systems signals from the second measurement device to a second IED configured to monitor the second portion of the electric power delivery system using received power system signals;
      a detection subsystem to detect that the first communication port has failed to receive the power system signals; and
      a rerouting subsystem to dynamically route the power system signals received at the third communication port from the second measurement device to the first IED via the second communication port and the second IED via the fourth communication port.

2. The system of claim 1, wherein the first measurement device comprises a first current transformer (CT) and the second measurement device comprises a second CT.

3. The system of claim 1, wherein the detection subsystem is configured to receive a notification of failure from an external monitoring device.

4. The system of claim 1, wherein the first communication port comprises a fiber optic port and the detection subsystem is configured to detect that the first communication port has failed to receive the power system signals based on a loss of fiber optic signal.

5. The system of claim 4, wherein the detection subsystem is configured to detect that the loss of fiber optic signal between sampled values from the first measurement device, such that the rerouting subsystem can dynamically route the power system signals from the third communication port to the first IED without any lost sampled values.

6. A system for providing electric power system signals to intelligent electronic devices (IEDs), comprising:
   a first measurement device to obtain measurement data from a first portion of the electric power delivery system;
   a second measurement device to obtain measurement data from a second portion of the electric power delivery system;
   a first IED to monitor the first portion of the electric power delivery system based on measurement data associated with the first portion of the electric power delivery system;
   a second IED to monitor the second portion of the electric power delivery system based on measurement data associated with the second portion of the electric power delivery system;
   a supervisory coordination device to determine a state of coordination of the first and second portions of the electric power delivery system as either a coordinated state with the first and second measurement devices capturing coordinated measurement data, or an uncoordinated state with the first and second measurement devices capturing uncoordinated measurement data; and
   a sampled values (SV) communicator to:
      in a default state, route measurement data from the first measurement device to the first IED, and route measurement data from the second measurement device to the second IED, and
      upon failure to receive measurement data from the first measurement device when the first and second portions are in a coordinated state, route measurement data from the second measurement device to the first IED and to the second IED.

7. The system of claim 6, wherein the supervisory coordination device is configured to determine that the first and second portions of the electric power system are in a coordinated state based on a determination that a switch connecting the first and second portions of the electric power system is closed.

8. The system of claim 6,
   wherein the first measurement device comprises:
      a first sensor to capture measurement data from the first portion of the electric power system; and
      a first merging unit to create digitized electrical signals of the measurement data from the first sensor for delivery to the communication system; and
   wherein the second measurement device comprises:
      a second sensor to capture measurement data from the second portion of the electric power system; and
      a second merging unit to create digitized electrical signals of the measurement data from the second sensor for delivery to the communication system.

9. The system of claim 8, wherein each of the first and second sensors comprises at least one of a: current transformer (CT) and a potential transformer (PT).

10. The system of claim 6, wherein the first measurement device comprises a first optical current transformer and the second measurement device comprises a second optical current transformer.

11. The system of claim 6, wherein the first and second portions of the electric power delivery system are capturing coordinated power measurement data when the measurement data is expected to be substantially identical based on modeling of system conditions.

12. The system of claim 6, wherein the SV communicator comprises a communication switch in communication with the first and second merging units and the first and second IEDs.

13. The system of claim 6, wherein the SV communicator comprises:
a first dynamic networking SV communicator in communication with the first merging unit and the first and second IEDs; and
a second dynamic networking SV communicator in communication with the second merging unit and the first and second IEDs.

14. The system of claim 13, wherein the first dynamic networking SV communicator is also in communication with the second merging unit; and the second dynamic networking SV communicator is also in communication with the first merging unit.

15. The system of claim 6, wherein the SV communicator identifies a failure to receive measurement data from the first measurement device based on a loss of a fiber optic communication signal.

16. A method of providing electric power system signals from merging units to intelligent electronic devices (IEDs), comprising:
obtaining electrical signals from a first portion of an electric power delivery system using a first merging unit;
creating digitized electrical signals from the obtained electrical signals from the first portion of the electric power delivery system by the first merging unit;
communicating the digitized electrical signals from the first portion of the electric power delivery system to a communication system;
obtaining electrical signals from a second portion of the electric power delivery system using a second merging unit;
creating digitized electrical signals from the second portion of the electric power delivery system by the second merging unit;
communicating the digitized electrical signals from the obtained electrical signals from the second portion of the electric power delivery system to the communication system;
communicating the digitized electrical signals from the first portion of the electrical power system to a first IED by the communication system;
communicating the digitized electrical signals from the second portion of the electrical power system to a second IED by the communication system;
the communication system determining a failure of the first merging unit to provide the digital electrical signals from the first portion of the electric power delivery system to the communication system; and,
communicating, upon failure of the first merging unit to provide the digitized electrical signals from the first portion of the electric power delivery system to the communication system, the digitized electrical signals from the second portion of the electric power delivery system to the first IED by the communication system.

17. The method of claim 16, further comprising determining that the first and second portions of the electric power system are coordinated by
checking that a switch between the first and second portions of the electric power delivery system is closed.

18. The method of claim 16, wherein the communication system comprises a first communication switch in communication with the first merging unit and the first and second IEDs; and a second communication switch in communication with the second merging unit and the first and second IEDs.

19. The method of claim 18, wherein the first communication switch is also in communication with the second IED, and the second communication switch is also in communication with the first IED.

20. The method of claim 16, wherein the communication system comprises a sampled values communicator.

* * * * *